(12) United States Patent
Hou et al.

(10) Patent No.: US 6,706,581 B1
(45) Date of Patent: Mar. 16, 2004

(54) DUAL GATE DIELECTRIC SCHEME: SION FOR HIGH PERFORMANCE DEVICES AND HIGH K FOR LOW POWER DEVICES

(75) Inventors: Tou-Hung Hou, Chia-Yi (TW); Ming-Fang Wang, Taichung (TW); Chi-Chun Chen, Kaohsiung (TW); Chih-Wei Yang, Kaohsiung (TW); Liang-Gi Yao, Hsing-Chu (TW); Shih-Chang Chen, Taoyuan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 59 days.

(21) Appl. No.: 10/282,387

(22) Filed: Oct. 29, 2002

(51) Int. Cl.⁷ .......................................... H01L 21/8238
(52) U.S. Cl. .................... 438/216; 438/240; 438/287
(58) Field of Search ................ 438/216, 199, 438/197, 240, 287

(56) References Cited

U.S. PATENT DOCUMENTS

| | | | |
|---|---|---|---|
| 5,960,289 A | 9/1999 | Tsui et al. | 438/275 |
| 6,159,782 A | 12/2000 | Xiang et al. | 438/197 |
| 6,211,034 B1 * | 4/2001 | Visokay et al. | 438/720 |
| 6,248,675 B1 | 6/2001 | Xiang et al. | 438/926 |
| 6,265,325 B1 | 7/2001 | Cao et al. | 438/763 |
| 6,309,936 B1 * | 10/2001 | Gardner et al. | 438/305 |
| 6,406,956 B1 * | 6/2002 | Tsai et al. | 438/238 |
| 6,420,742 B1 * | 7/2002 | Ahn et al. | 438/3 |
| 6,455,330 B1 * | 9/2002 | Yao et al. | 438/3 |
| 6,482,726 B1 * | 11/2002 | Aminpur et al. | 438/197 |

FOREIGN PATENT DOCUMENTS

TW  426941  3/2001

OTHER PUBLICATIONS

"Outlook on New Transistor Materials" by L. Peters in Semiconductor International, Oct. 1, 2001 edition.

* cited by examiner

Primary Examiner—Kevin M. Picardat
(74) Attorney, Agent, or Firm—George O. Saile; Stephen B. Ackerman (57) ABSTRACT

A method of forming dual gate dielectric layers that is extendable to satisfying requirements for 50 nm and 70 nm technology nodes is described. A substrate is provided with STI regions that separate device areas. An interfacial layer and a high k dielectric layer are sequentially deposited on the substrate. The two layers are removed over one device area and an ultra thin silicon oxynitride layer with an EOT <10 nm is grown on the exposed device area. The high k dielectric layer is annealed during growth of the SiON dielectric layer. The high k dielectric layer is formed from a metal oxide or its silicate or aluminate and enables a low power device to be fabricated with an EOT <1.8 nm with a suppressed leakage current. The method is compatible with a dual or triple oxide thickness process when forming multiple gates.

31 Claims, 5 Drawing Sheets

DUAL GATE DIELECTRIC SCHEME: SION FOR HIGH PERFORMANCE DEVICES AND HIGH K FOR LOW POWER DEVICES

FIELD OF THE INVENTION

The present invention relates to a method of semiconductor manufacturing. In particular, the method involves forming two or more gate dielectric layers comprised of different materials during the fabrication of integrated circuits for system on a chip (SOC) technology.

BACKGROUND OF THE INVENTION

Complimentary metal oxide semiconductor (CMOS) field effect transistor (FET) technology is being driven to smaller gate electrode sizes by a constant demand for higher performance. As stated in an article "Outlook on New Transistor Materials" by L. Peters in Semiconductor International, Oct. 1, 2001 edition, the next generation 70 nm and 50 nm technology nodes will need new gate dielectric materials in order to accommodate a shrinking gate size. A high k dielectric option comprised of a metal oxide is a leading candidate to replace the traditional oxide or oxynitride layer. A higher k value in materials such as $Ta_2O_5$, $TiO_2$, $Al_2O_3$, $ZrO_2$, $HfO_2$, $Y_2O_3$, $L_2O_5$ and their aluminates and silicates will enable an increase in the physical dielectric thickness to suppress tunneling current which causes a high gate leakage current in transistors. The high k dielectric material can be formed as an amorphous layer or as a monocrystalline layer. The interfacial layer for the gate dielectric includes oxides, nitrides, oxynitrides, and aluminates. In some cases an interfacial layer is omitted and the gate dielectric material is formed directly on silicon.

The thickness of the gate oxide is critical to the performance of the device. There is a constant need for thinner oxides to allow a higher speed device with lower power consumption. Current technology requires gate oxide thicknesses of about 50 Angstroms or less. For ultra thin silicon dioxide gates, leakage current will increase tremendously as thickness is reduced. This will cause a large current in the standby mode ($I_{OFF}$) and a large standby power consumption, thereby making products with these devices commercially unacceptable. Thus, new gate dielectric materials are required to suppress gate leakage as the gate dielectric thickness approaches 20 nm or less.

With the introduction of system on a chip (SOC) technology, there is a need to form multiple gate dielectric thicknesses on a substrate to enable different functions to perform simultaneously. For example, circuits for I/O connections, high performance devices, and low power devices must be fabricated on the same substrate. While low power circuits currently require an effective gate oxide thickness (EOT) of 12 to 15 Angstroms and high performance circuits need an EOT in the range of 8 to 12 Angstroms, the IC industry predicts the driver for high k dielectrics will be the low power application with an estimated EOT=1.8 nm in 2005. Silicon oxynitride (SiON) can function adequately as the gate dielectric for high performance devices until 2005, but for low power devices the switch to high k dielectrics must occur for an EOT <17 Angstroms in order to satisfy the leakage requirements.

A method for forming dual gate oxide layers having different thicknesses is described in U.S. Pat. No. 6,265,325 in which a field oxide separates two device areas. After a thermal oxide layer is grown and a polysilicon layer is deposited, a photoresist mask is used to selectively uncover the substrate in one device area. A second oxide layer is grown that is thinner than the first oxide. Then a second polysilicon layer is formed over both device areas. A planarization step is employed to make the second polysilicon layer coplanar with the first polysilicon layer.

Another method for fabricating a dual oxide gate structure is provided in U.S. Pat. No. 5,960,289. An oxide in the range of 50 to 240 Angstroms thick is grown between shallow trench isolation (STI) regions and is protected by subsequently depositing a thin silicon oxynitride (SiON) layer. A photoresist layer is coated and patterned and serves as an etch mask for selectively removing the $SiO_2$ and SiON over one device region. A thin oxide which is 20 to 60 Angstroms thick is then grown over the exposed device region while SiON prevents any additional oxide growth on the other device region. This prior art and the previous case do not address extendibility to gate dielectric thicknesses less than 20 Angstroms where high k dielectric materials will be needed.

Related U.S. Pat. Nos. 6,159,782 and 6,248,675 introduce a high k dielectric approach for manufacturing an N-channel MOSFET and a P-channel MOSFET on the same substrate. High temperature processes such as activation anneal of implanted ions and silicidation anneal are performed on a dummy gate electrode and sacrificial gate dielectric so as to preserve the integrity of a $Ta_2O_5$ high k dielectric that is deposited later and is sensitive to temperatures over 800° C. Once the dummy gate electrode is removed by etching to form a gate opening, a conformal layer of SiON is deposited followed by a conformal layer of $Ta_2O_5$. The opening is filled with amorphous silicon, planarized, and is then annealed at <600° C. to produce a permanent gate electrode. However, the method does not teach how to form a dielectric layer for a high performance device and a high k dielectric layer for a low power device on the same substrate for a SOC application.

Therefore, a method is needed whereby a gate dielectric layer with an EOT of less than 10 nm for a high performance device and a high k dielectric layer with an EOT preferably <10 nm for a low power device can be formed on the same substrate for current and future SOC applications.

SUMMARY OF THE INVENTION

An objective of the present invention is to provide a method of forming a SiON dielectric layer and a high k dielectric layer on the same substrate during the fabrication of a semiconductor device, micro-electromechanical (MEMS) device, or other device requiring the formation of a gate electrode on a substrate.

A further objective of the present invention is to provide a method of forming a high k dielectric layer that is scalable to the 70 nm and 50 nm technology nodes, preferably with an EOT that is <1.8 nm for a low power device.

A still further objective of the present invention is to provide a dual gate dielectric scheme that is compatible with a conventional dual or triple thickness $SiO_2$ process. A still further objective is to provide an efficient, low cost dual gate dielectric process in which the high k dielectric layer can be annealed simultaneously with the growth of the second dielectric layer.

These objectives are achieved by first providing a substrate with device areas separated by regions of insulating material such as STI features. In the first embodiment, an interfacial layer comprised of $SiO_2$, SiON, or $Si_3N_4$ is deposited on the substrate. A high k dielectric material is then deposited by a chemical vapor deposition (CVD), metal-organic CVD (MOCVD), or atomic layer CVD (ALD) process. The high k dielectric material is selected from a group of metal oxides including $Ta_2O_5$, $TiO_2$, $Al_2O_3$, $ZrO_2$, $HfO_2$, $Y_2O_3$, $L_2O_3$ and their aluminates and silicates. The high k dielectric material may comprise a single layer of one metal oxide or several layers including two or more metal oxides. A photoresist is coated and patterned on the high k dielectric layer to uncover the substrate in a region that will form the high performance device. After the high k dielectric and interfacial layers are removed in exposed regions, the photoresist is stripped and the substrate is cleaned. An ultra thin SiON layer with an EOT of preferably <10 nm is then deposited by using a silicon source gas in combination with $NH_3$, NO or $N_2$ with $O_2$. During the deposition of the second dielectric layer, the high k dielectric layer is annealed in an in-situ process. A post-deposition anneal involving $NH_3$ or a nitrogen containing gas may be added to further reduce leakage current and lower EOT. Conventional processing is followed to complete the construction of a MOSFET that is a low power device from the region containing the high k dielectric layer and a MOSFET that is a high performance device from the region containing the SiON dielectric layer.

In a second embodiment, a substrate is provided in which STI regions separate device areas that will become a low power device, a high performance device, and an I/O device. An interfacial layer comprised of SiON, $Si_3N_4$ or $SiO_2$ is deposited on the substrate. A high k dielectric material is then deposited by a CVD, MOCVD, or ALD process. The high k dielectric material is selected from a group metal oxides and their aluminates and silicates described in the first embodiment. The high k dielectric material may comprise a single layer of one metal oxide or several layers including two or more metal oxides. A photoresist is coated and patterned on the high k dielectric layer to uncover the substrate in a region that will form the high performance device and which will form the I/O device. After the high k dielectric and interfacial layers are removed from exposed regions, the photoresist is stripped and the substrate is cleaned. An ultra thin SiON layer with an EOT of preferably <10 nm is then deposited by using a silicon source gas in combination with $NH_3$, NO or $N_2$ with $O_2$. During the deposition of the second dielectric layer that will become part of the high performance device, the high k dielectric layer is annealed. A second photoresist is then coated and patterned to expose the high k dielectric layer above the I/O device area. An etch selectively removes the SiON layer over the third device area. After a photoresist strip and a cleaning step, an oxide layer is grown on the third device area to form a gate dielectric layer with a thickness that is consistent with an I/O device.

BRIEF DESCRIPTION OF THE DRAWINGS

The drawings illustrate embodiments of the invention and together with the description serve to explain the principles of the present invention.

DETAILED DESCRIPTION OF THE INVENTION

The present invention provides a method for forming a high k dielectric layer and an SiON dielectric layer on the same substrate. In the first embodiment, the high k dielectric layer is incorporated into a low power device and the SiON dielectric layer is incorporated into a high performance device.

Figure 1A:
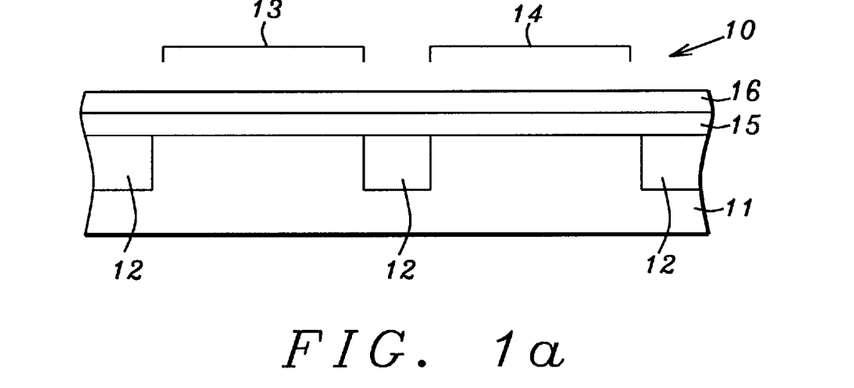
FIG. 1a is a cross sectional view of a structure having two device areas separated by STI regions and upon which an interfacial layer and a high k dielectric layer have been formed.

While the drawings in FIGS. 1a–1e are intended to give a description of the first embodiment, the scope of the present invention is not limited by the drawings. For example, the FIGS. 1a–1e are not necessarily drawn to scale. In addition, the substrate is simplified in the drawings and a substructure containing other devices and sub-layers is not shown. Referring to FIG. 1a, a structure 10 is shown which consists of a substrate 11 and shallow trench isolation regions 12 that separate device areas 13 and 14. A MOSFET which is a low power device will be fabricated on device area 13 and a MOSFET which is a high performance device will be fabricated on device area 14. The substrate 11 is preferably silicon but may be made of gallium arsenide, silicon-germanium, or silicon-on-insulator (SOI) substrates. Furthermore, the substrate 11 may contain dopants that are either n-type or p-type dopants. STI regions 12 contain an insulating material such as silicon dioxide and are formed by a conventional method that is not described herein.

An interfacial layer 15 is deposited on substrate 11 to a thickness between 0 and 30 Angstroms and consists of a material such as $SiO_2$, SiON, or silicon nitride. The interfacial layer 15 is preferably formed by a rapid thermal process (RTP) in a temperature range of about 500° C. to 1000° C. although a plasma enhanced CVD or a low pressure CVD can also be used for the deposition. When the layer is SiON, the RTP preferably involves a silane or silicon containing gas as well as $NH_3$. Optionally, the RTP may include $N_2O$, $O_2$ or NO in combination with $NH_3$, or $N_2$ and $O_2$ instead of $NH_3$.

A high k dielectric stack 16 is then formed on the interfacial layer 15 by a CVD, MOCVD, or ALD process. The interfacial layer may not be required in some cases but generally an interfacial layer 15 is preferred in order to enable a smooth interface between the substrate 11 and the high k dielectric stack 16. A pre-gate cleaning step which is suitable for high-k deposition can be inserted before the high k dielectric stack 16 deposition. Such a cleaning step typically involves a hydrophilic or hydrophobic technique that is well known to those skilled in the art. The high k dielectric stack 16 may consist of a single layer or may be two or more layers comprising one or more materials selected from the group including $Ta_2O_5$, $TiO_2$, $Al_2O_3$, $ZrO_2$, $HfO_2$, $Y_2O_3$, $L_2O_3$ and their aluminates and silicates. A preferred thickness of the high k dielectric stack 16 is from about 15 to 100 Angstroms.

Figure 1B:
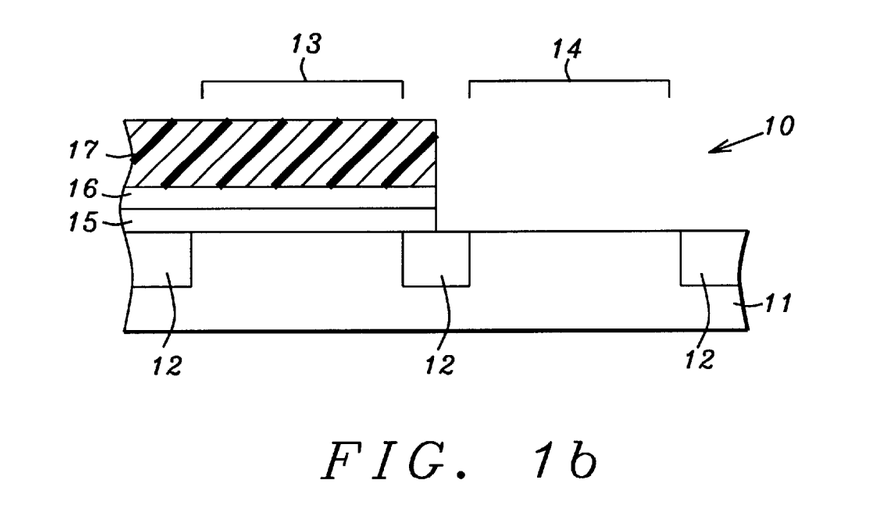
FIG. 1b is a cross sectional view of the two device areas in FIG. 1a after a patterned photoresist was used as an etch mask for the removal of the layers above one device area.

Referring to FIG. 1b, a photoresist 17 is coated on the high k dielectric stack 16 and patterned such that regions of photoresist 17 are washed away above device area 14 and remain on device area 13. A wet etch or plasma etch is then performed to selectively remove layers 15 and 16 that have been exposed by the opening in photoresist 17. Some metal oxides such as $HfO_2$ are very resistant to HF and wet etchants like $H_2SO_4/H_2O_2$ (SPM). Therefore, a plasma etch may be preferred for removal of the high k dielectric stack 16. If the high k dielectric layer is a silicate of a metal oxide such as $Hf_xSi_yO_z$, then a buffered HF etch may be preferred for removing high k dielectric stack 16. A wet etch with a buffered HF solution is normally used to remove silicon oxynitride layer 15.

Figure 1C:
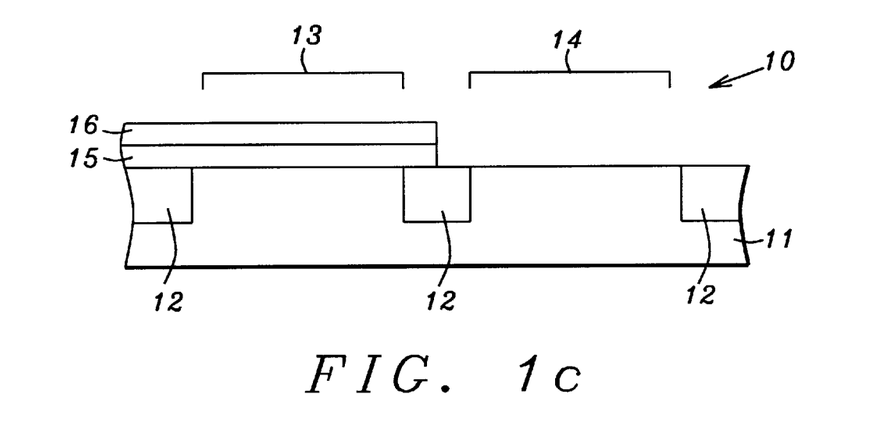
FIG. 1c is a cross sectional view of the two device areas in FIG. 1b with the photoresist removed and a second dielectric layer formed on the second device area.

Referring to FIG. 1c, the photoresist 17 is stripped by an oxygen ashing method or by immersing the structure 10 in a liquid stripper. The structure 10 is then typically cleaned by immersing sequentially in $NH_4OH/H_2O_2$ (SC-1) and $HCl/H_2O_2$ (SC-2) cleaning solutions that are part of the standard RCA cleaning process followed by DI water rinsing and drying.

An ultra thin dielectric layer 18 is then grown on device area 14 and during the process the high k dielectric stack 16 is annealed. When dielectric layer 18 is silicon oxynitride, layer 18 preferably has an EOT <10 nm. Layer 18 also covers STI regions 12 that are exposed after removal of interfacial layer 15 and high k dielectric stack 16. The annealing is a rapid thermal process and is performed in a temperature range of about 500° C. to 1000° C. for about 10 to 500 seconds and may include $O_2$, $N_2$, NO, $NH_3$, or any combination of the aforementioned gases. When only an oxygen ambient is employed, a dielectric layer 18 comprised of $SiO_2$ is formed instead of SiON. The annealing improves the quality of the high k dielectric material and lowers the leakage current in the MOSFET that is formed from the dielectric stack 16

Figure 3:
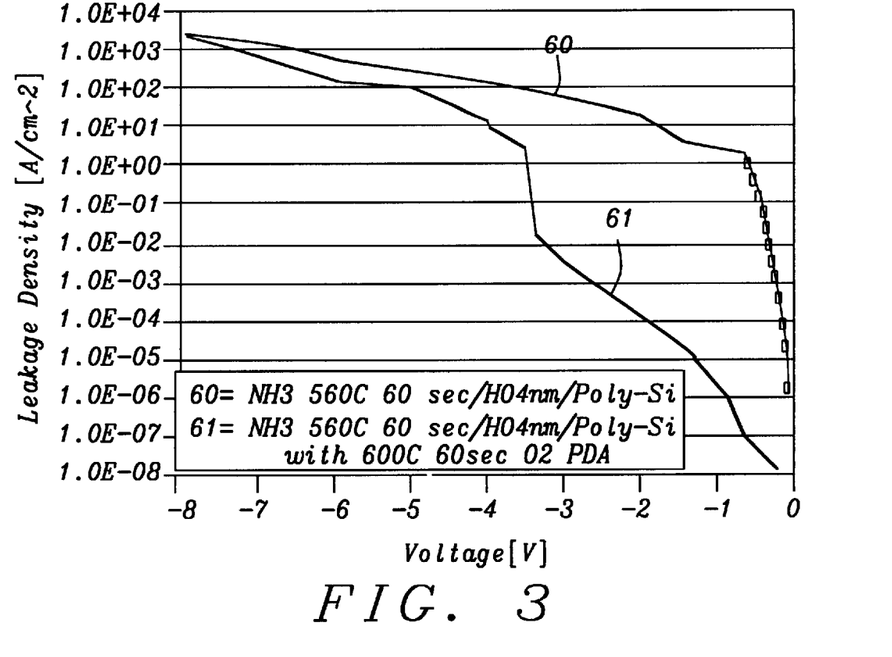
FIG. 3 is a plot of voltage vs. leakage density showing a reduction in leakage current following an oxygen anneal of a $HfO_2$ high k dielectric layer.

For example, when the high k dielectric stack 16 is a layer of $HfO_2$ that is deposited on an SiON interfacial layer that has been formed under conditions including ammonia at 560° C., the top curve 60 in the plot depicted in FIG. 3 shows the leakage current associated with a particular applied voltage in a device fabricated from this stack. A significant improvement is noted when the $HfO_2$ layer 16 is annealed in an $O_2$ ambient at 600° C. for 60 seconds. The lower curve 61 in FIG. 3 indicates that the post-deposition anneal with $O_2$ reduces the leakage current significantly, especially for a normal operating voltage of about 2 V.

Figure 4:
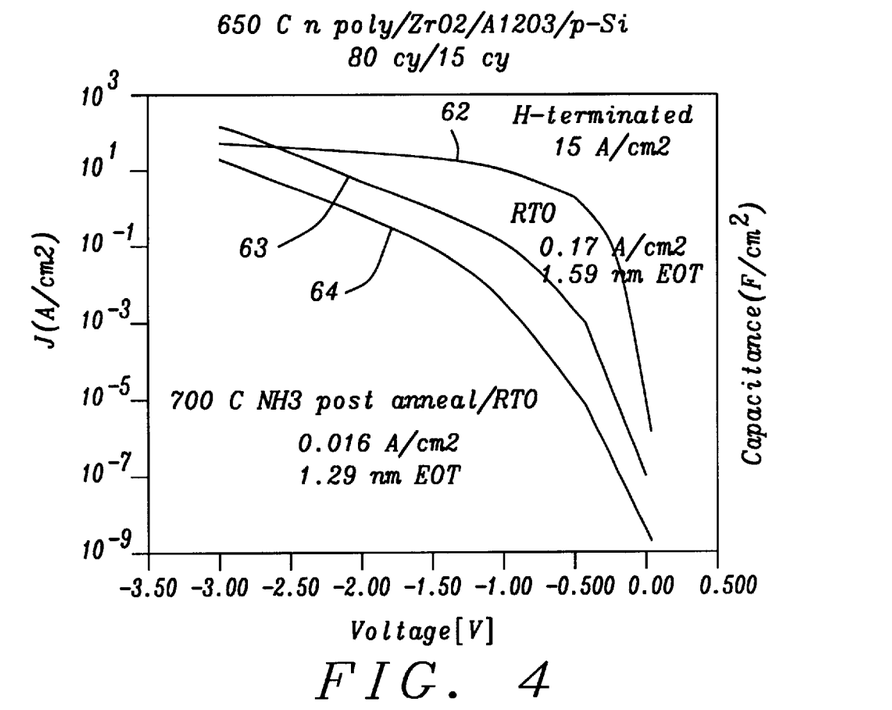
FIG. 4 is a plot of voltage vs. leakage current showing a reduction in leakage current when an $NH_3$ anneal follows an oxygen anneal of a high k dielectric layer comprised of $ZrO_2$ and $Al_2O_3$.

When the high k dielectric stack 16 is comprised of $ZrO_2$ and $Al_2O_3$ layers, then an anneal with $NH_3$ is especially effective in reducing the leakage current as illustrated in FIG. 4. The top curve 62 in the plot depicted in FIG. 4 shows the leakage current vs. voltage in a device fabricated from a high k dielectric stack with $ZrO_2/Al_2O_3$ which has no interfacial layer 15. The middle curve 63 indicates a lower leakage current of $ZrO_2/Al_2O_3$ grown on a rapid thermal oxidation (RTO) surface. The lower curve 64 in FIG. 4 shows the leakage current is further reduced after a post deposition anneal with $NH_3$ at 700° C. Note that the EOT also decreases from 1.59 nm to 1.29 nm following the $NH_3$ anneal.

Figure 1D:
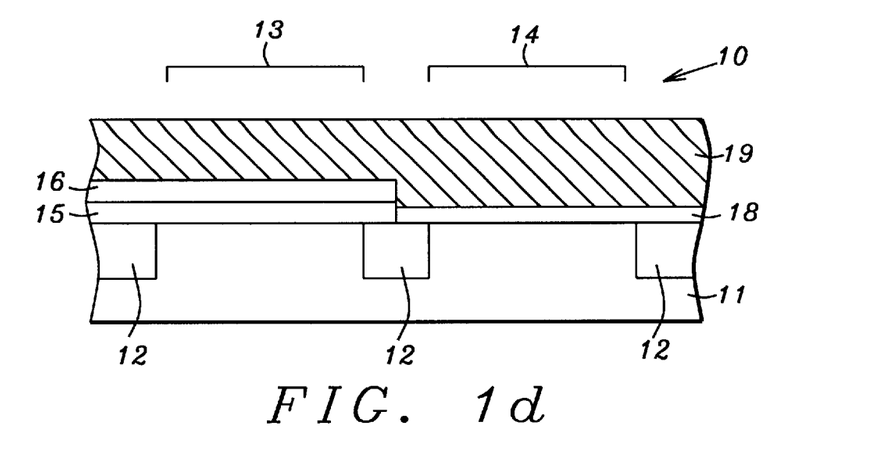
FIG. 1d is a cross sectional view of the two device areas in FIG. 1c after a polysilicon layer is deposited on the substrate.

Referring to FIG. 1d, a conductive layer 19 is deposited on device areas 13 and 14. Preferably, the conductive layer 19 is polysilicon that may be doped with boron, arsenic, phosphorus, or other useful dopant atoms. Layer 19 can also be comprised of other known gate electrode materials such as amorphous silicon.

Figure 1E:
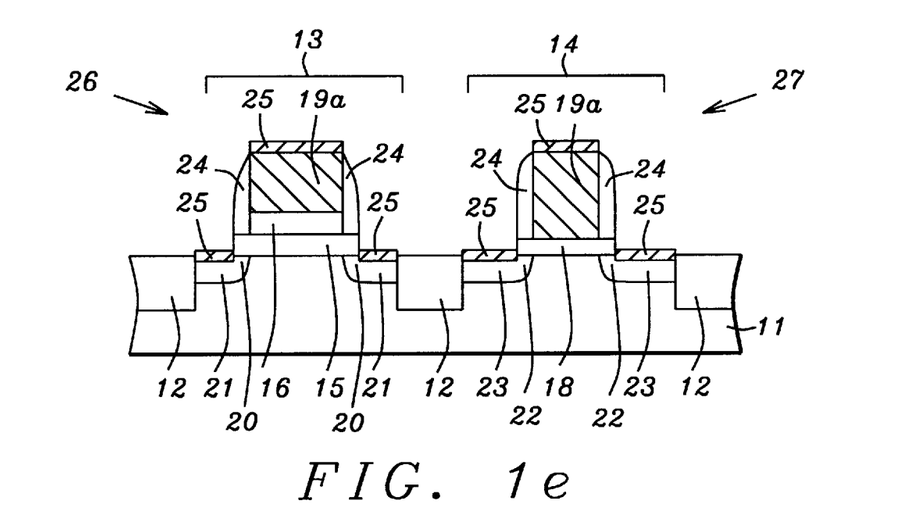
FIG. 1e is a cross sectional view after MOSFETs for a low power device and a high performance device have been fabricated on the same substrate.

Referring to FIG. 1e, a MOSFET is fabricated in device areas 13 and 14 from the structure 10 shown in FIG. 1d. A photoresist (not shown) is patterned and serves as an etch mask for etching the gate electrode pattern through layer 19 to form gate electrodes 19a in device regions 13 and 14. Then gate dielectric stack 16, gate dielectric layer 18, and interfacial layer 15 are etched in a self-aligned manner. Typically, an ion implant is performed to form lightly doped regions 20, 22 in substrate 11 adjacent to gate electrodes 19a. Conventional processing is followed to introduce nitride spacers 24 on the sides of the electrodes 19a and to form heavily doped source/drain (S/D) regions 21, 23 in the substrate 11. Silicide regions 25 are formed on gate electrodes 19a and above heavily doped S/D regions 21, 23. Contacts (not shown) can then be made to silicide regions 25 from an overlying conductive layer in subsequent processing. The result is that structure 10 comprises a MOSFET 26 that is a lower power device and a MOSFET 27 which is a high performance device.

The advantage of the first embodiment over prior art is that MOSFET 26 contains a high k dielectric layer 16 that enables the low power device to meet future requirements of <1.8 nm EOT. Gate leakage current has been suppressed to an acceptable level. Furthermore, on the same substrate, a MOSFET 27 has been fabricated which contains a SiON gate dielectric layer that is extendable to <1 nm EOT to satisfy future requirements for 50 and 70 nm technology nodes. The method can be readily implemented in a manufacturing scheme at a minimal cost, especially when the high k dielectric anneal step is performed in-situ with the silicon oxynitride deposition of the second gate dielectric layer.

In a second embodiment, a method is provided for forming three distinct devices on the same substrate. A high k dielectric layer is incorporated in a low power device, and silicon oxynitride or $SiO_2$ layers are incorporated in high performance and I/O devices. While the drawings in FIGS. 2a–2g are intended to give a description of the second embodiment, the scope of the present invention is not limited by the drawings. For example, the FIGS. 2a–2g are not necessarily drawn to scale. In addition, the substrate is simplified in the drawings and a substructure containing other devices and sub-layers is not shown.

Figure 2A:
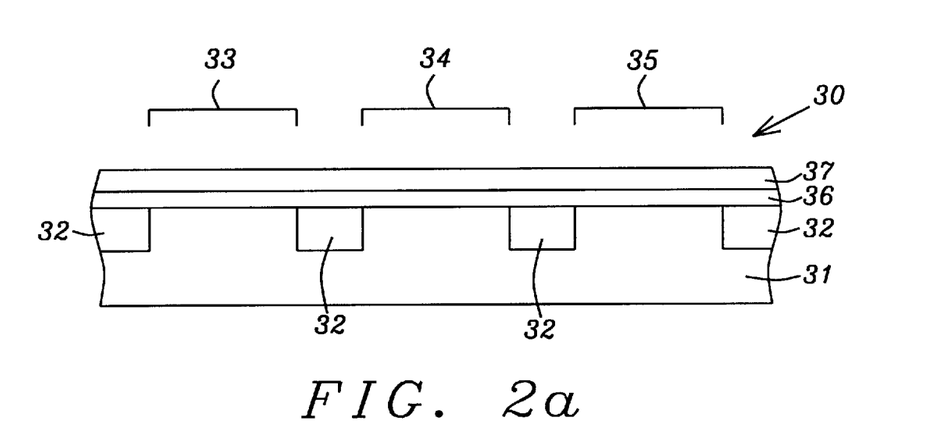
FIG. 2a is a cross sectional view of a structure having three device areas separated by STI structures on a substrate.

Referring to FIG. 2a, a structure 30 is shown which consists of a substrate 31 and shallow trench isolation regions 32 that separate device areas 33, 34 and 35. A low power device will be fabricated on device area 33 while a high performance device and an I/O device will be fabricated on device areas 34 and 35, respectively. The substrate 31 is preferably silicon but may be made of gallium arsenide, silicon-germanium, or silicon-on-insulator (SOI) substrates. Furthermore, the substrate 31 may contain dopants that are either n-type or p-type dopants. STI regions 32 contain an insulating material such as silicon dioxide and are formed by a conventional method that is not described herein.

An interfacial layer 36 is deposited on substrate 31 to a thickness between about 0 and 15 Angstroms and consists of a material such as $SiO_2$, SION, or silicon nitride. The interfacial layer 36 is preferably formed by a rapid thermal process (RTP) in a temperature range of between 500° C. and 1000° C. although a plasma enhanced CVD or a low pressure CVD can also be used for the deposition. When the layer 36 is silicon oxynitride, the RTP preferably involves a silane or silicon containing source gas as well as $NH_3$. Optionally, the RTP may include $N_2O$, $O_2$ or NO in combination with $NH_3$, or $N_2$ and $O_2$ instead of $NH_3$.

A high k dielectric stack 37 is then formed on the interfacial layer 36 by a CVD, MOCVD, or ALD process. The interfacial layer may not be required in some cases but generally an interfacial layer 36 is preferred in order to enable a smooth interface between the substrate 31 and the high k dielectric stack 37. A pre-gate cleaning step which is suitable for high-k deposition can be inserted before the high k dielectric stack 37 deposition. Such a cleaning step typically involves a hydrophilic or hydrophobic technique that is well known to those skilled in the art. The high k dielectric stack 37 may consist of a single layer or may be two or more layers comprising one or more materials selected from the group including $Ta_2O_5$, $TiO_2$, $Al_2O_3$, $ZrO_2$, $HfO_2$, $Y_2O_3$, $L_2O_3$ and their aluminates and silicates. A preferred thickness of the high k dielectric stack 37 is from about 15 to 100 Angstroms.

Figure 2B:
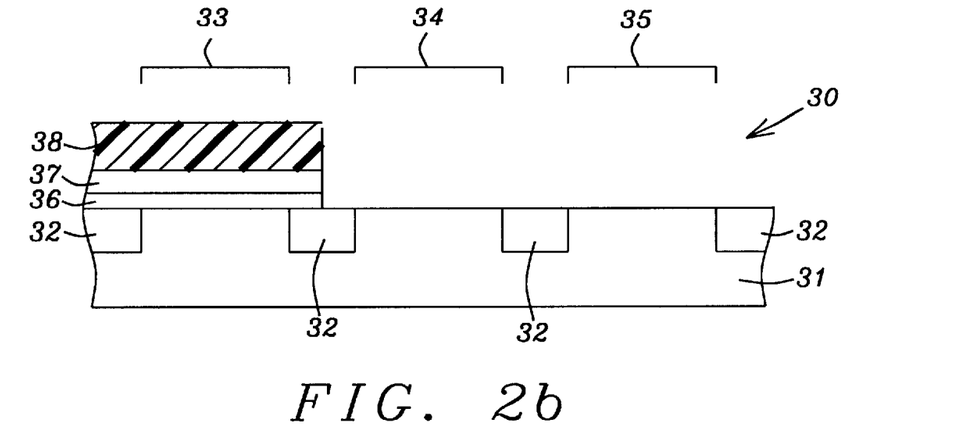
FIG. 2b is a cross sectional view of the three device areas in FIG. 2a after a patterned photoresist was used as an etch mask for the removal of the layers above two device areas.

Referring to FIG. 2b, a photoresist 38 is coated on the high k dielectric stack 37 and patterned such that regions of photoresist 38 are washed away by developer above device areas 34 and 35 and remain on device area 33. A wet etch or plasma etch as described is then performed to selectively remove layers 36 and 37 that have been exposed by the opening in photoresist 38. Some metal oxides such as $HfO_2$ are very resistant to HF and wet etchants like $H_2SO_4/H_2O_2$ (SPM). Therefore, a plasma etch may be preferred for removal of the high k dielectric stack 37. If the high k dielectric material is a silicate of a metal oxide such as $Hf_xSi_yO_z$, then a buffered HF etch may be preferred for removing high k dielectric stack 37. A wet etch involving a buffered HF solution is normally used to remove silicon oxynitride layer 36.

Figure 2C:
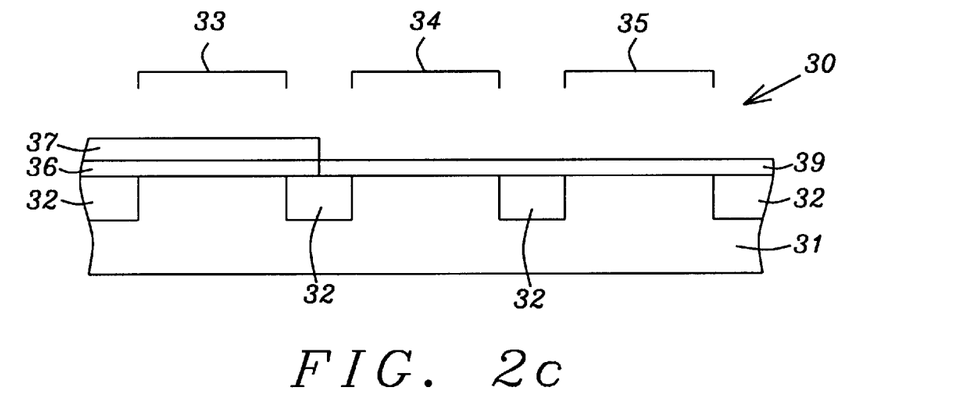
FIG. 2c is a cross sectional view of the three device areas in FIG. 2b with the photoresist removed and a second dielectric layer formed on two device areas.

Referring to FIG. 2c, the photoresist 38 is stripped by an oxygen ashing method or by immersing the structure 30 in a liquid stripper. The structure 30 is then typically cleaned by immersing sequentially in $NH_4OH/H_2O_2$ (SC-1) and $HCl/H_2O_2$ (SC-2) cleaning solutions that are part of the standard RCA cleaning process followed by DI water rinsing and drying.

An ultra thin dielectric layer 39 is then grown on device areas 34, 35 and during the process the high k dielectric stack 37 is annealed. When the dielectric layer 39 is silicon oxynitride, layer 39 preferably has an EOT <10 nm. Layer 39 also covers STI regions 32 that are exposed after removal of interfacial layer 36 and high k dielectric stack 37. The annealing is a rapid thermal process and is performed in a temperature range of about 500° C. to 1000° C. for about 10 to 500 seconds and may include $O_2$, $N_2$, NO, $NH_3$, or any combination of the aforementioned gases. When only an oxygen ambient is employed, a dielectric layer 39 comprised of $SiO_2$ is formed instead of SiON. The annealing improves the quality of the high k dielectric material and lowers the leakage current in the MOSFET that is formed from the dielectric stack 37.

For example, when the high k dielectric stack 37 is a layer of $HfO_2$ that is deposited on a SiON interfacial layer that has been formed under conditions involving ammonia at 560° C., the top curve 60 in the plot depicted in FIG. 3 shows the leakage current associated with a particular applied voltage in a device fabricated from this stack. A significant improvement is noted when the $HfO_2$ layer 37 is annealed in an $O_2$ ambient at 600° C. for 60 seconds. The lower curve 61 in FIG. 3 indicates that the post-deposition anneal with $O_2$ reduces the leakage current significantly, especially for a normal operating voltage of about 2 V.

When the high k dielectric stack 37 is comprised of $ZrO_2$ and $Al_2O_3$ layers, then an anneal with $NH_3$ is especially effective in reducing the leakage current as illustrated in FIG. 4. The top curve 62 in the plot depicted in FIG. 4 shows the leakage current vs. voltage in a device fabricated from a high k dielectric stack with $ZrO_2/Al_2O_3$ which has no interfacial layer 36. The middle curve 63 indicates a lower leakage current of $ZrO_2/Al_2O_3$ grown on a rapid thermal oxidation (RTO) surface. The lower curve 64 in FIG. 4 shows the leakage current is further reduced after a post deposition anneal with $NH_3$ at 700° C. Note that the EOT also decreases from 1.59 nm to 1.29 nm following the $NH_3$ anneal.

Figure 2D:
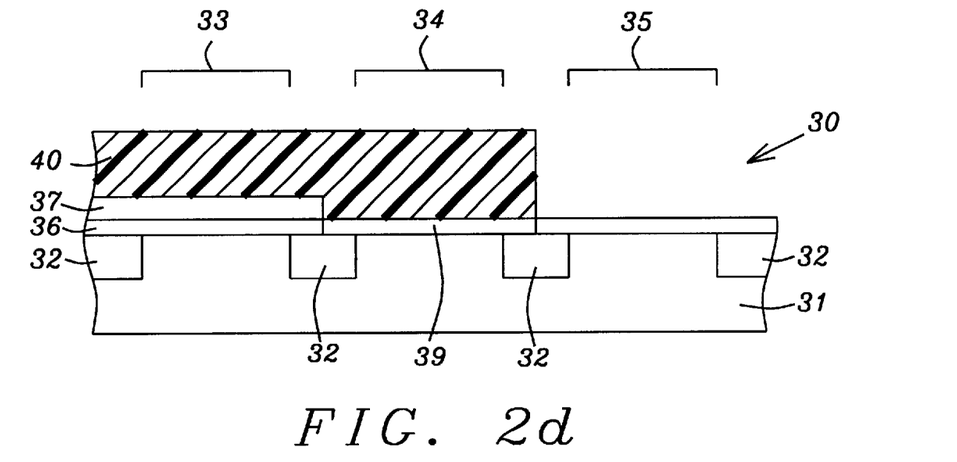
FIG. 2d is a cross sectional view of the three device areas in FIG. 2c after a patterned photoresist was used as an etch mask for the removal of the second dielectric layer above the third device area.

Referring to FIG. 2d, a photoresist 40 is coated on the high k dielectric stack 37 and on dielectric layer 39 and is patterned such that regions of photoresist 40 are washed away by developer above device area 35 and remain on device areas 33 and 34. A wet etch or plasma etch is then performed to selectively remove layer 39 in device area 35 that has been exposed by the opening in photoresist 40 which results in a structure 30.

Figure 2E:
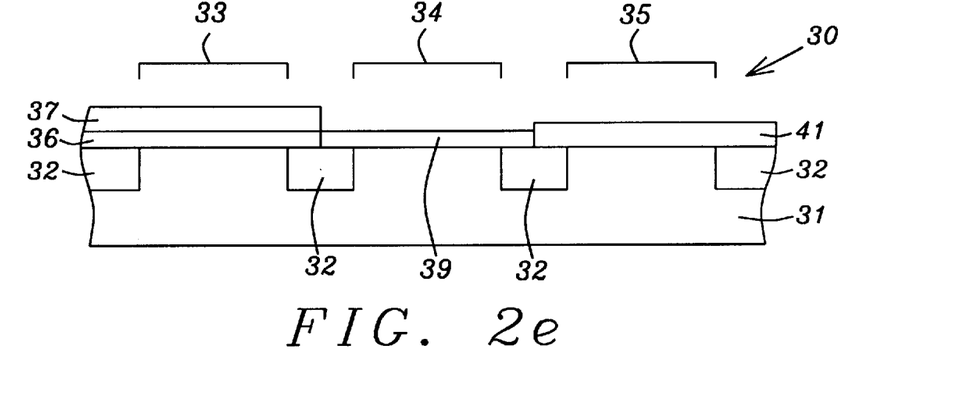
FIG. 2e is a cross sectional view of the three device areas in FIG. 2d with the photoresist removed and a third dielectric layer formed on the third device area.

Referring to FIG. 2e, the photoresist 40 is stripped by an oxygen ashing method or by a liquid stripper and structure 30 is then cleaned as before with SC-1 and SC-2 solutions. Next a $SiO_2$ layer 41 is formed by a rapid thermal oxidation method with a thickness between about 10 and 100 Angstroms that is consistent with a dielectric layer for an I/O device in device area 35. When dielectric layer is 39 is silicon oxynitride, layer 39 prevents any further oxidation of device area 34. If dielectric layer 39 is $SiO_2$, the thickness of layer 39 in device area 34 increases slightly during the $SiO_2$ growth in device area 35.

Figure 2F:
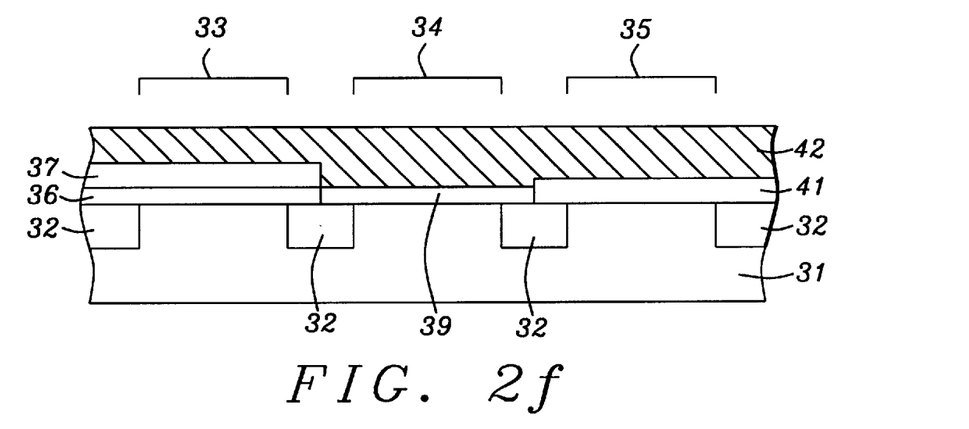
FIG. 2f is a cross sectional view of the three device areas in FIG. 2e after a polysilicon layer is deposited on the substrate.

FIG. 2f shows that a conductive layer 42 is deposited on device areas 33, 34, and 35. Preferably, the conductive layer 42 is polysilicon that may be doped with boron, arsenic, phosphorus, or other useful dopants. Layer 42 can also be comprised of other known gate electrode materials such as amorphous silicon.

Figure 2G:
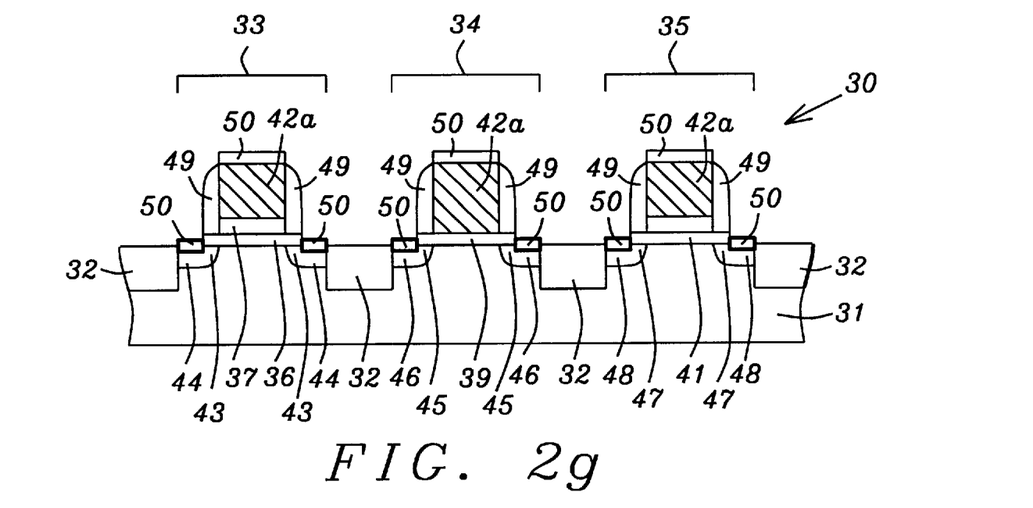
FIG. 2g is a cross sectional view after MOSFETs for a low power device, a high performance device and an I/O device are formed on the same substrate.

Referring to FIG. 2g, a MOSFET is fabricated in each of device areas 33, 34 and 35. A photoresist (not shown) is patterned and serves as an etch mask for etching the gate electrode pattern through layer 42 to form gate electrodes 42a in device areas 33, 34 and 35. Then gate dielectric stack 37, dielectric layers 39, 41, and interfacial layer 36 are etched in a self-aligned manner. Typically, an ion implant is performed to form lightly doped regions 43, 45 and 47 in substrate 31 adjacent to gate electrodes 42a. Conventional processing is followed to introduce nitride spacers 49 on the sides of the electrodes 42a and on the sidewalls of layers 36, 37. An ion implant is generally employed to form heavily doped source/drain (S/D) regions 44, 46, 48 in the substrate 31. Silicide regions 50 are formed on gate electrodes 42a and above heavily doped S/D regions 44, 46, and 48. Contacts (not shown) can then be made to silicide regions 50 from an overlying conductive layer in subsequent processing. The result is that structure 30 comprises a MOSFET 33 that is a lower power device, a MOSFET 34 that is a high performance device, and a MOSFET 35 which is an I/O device. The method is compatible with dual oxide dielectric thicknesses since dielectric layers 39 and 41 may both be $SiO_2$ and have differing thicknesses. Those skilled in the art will recognize that the method can be expanded to include three or more gate dielectric layers with differing $SiO_2$ thicknesses by repeating the steps depicted in FIGS. 2d and 2e for each additional gate dielectric layer.

An advantage of the second embodiment over prior art is that a device containing a high k dielectric layer which enables the low power device to meet future requirements of <1.8 nm EOT is formed on the same substrate with a high performance device having a gate dielectric EOT that is extendable to <1 nm for 50 nm and 70 nm technology nodes. Furthermore, an I/O device that provides greater SOC capability is also formed on the same substrate. Gate leakage current has been suppressed to an acceptable level in the low power device. The method can be readily implemented in a manufacturing scheme at a minimal cost, especially when the high k dielectric anneal step is performed in-situ with the deposition of the second gate dielectric layer.

While this invention has been particularly shown and described with reference to, the preferred embodiments thereof, it will be understood by those skilled in the art that various changes in form and details may be made without departing from the spirit and scope of this invention.

We claim:

1. A method of forming dual gate dielectric layers on a substrate comprising:
   (a) providing a substrate with isolation regions that separate device areas;
   (b) depositing an interfacial layer on said substrate;
   (c) depositing a high k dielectric stack on said interfacial layer;
   (d) removing the interfacial layer and high k dielectric stack over one device area; and
   (e) growing a second dielectric layer on the exposed device area, said growth simultaneously anneals said high k dielectric layer.

2. The method of claim 1 wherein the isolation regions are shallow trench isolation features in a silicon substrate.

3. The method of claim 1 wherein the interfacial layer is comprised of silicon oxynitride, $SiO_2$, or silicon nitride with a thickness between about 1 and 30 Angstroms.

4. The method of claim 1 wherein the interfacial layer is omitted and the high k dielectric stack is deposited on the substrate.

5. The method of claim 1 wherein the high k dielectric stack is deposited to a thickness from about 15 to 100 Angstroms.

6. The method of claim 1 wherein the high k dielectric stack is comprised of a high k dielectric material selected from the group including $Ta_2O_5$, $TiO_2$, $Al_2O_3$, $ZrO_2$, $HfO_2$, $Y_2O_3$, $L_2O_3$ and their aluminates and silicates.

7. The method of claim 6 wherein the high k dielectric stack is comprised of two or more layers comprised of one or more of said high k dielectric materials.

8. The method of claim 1 wherein a photoresist is patterned on said high k dielectric layer and serves as an etch mask for selectively removing the interfacial layer and high k dielectric layer over one device area.

9. The method of claim 8 further comprising stripping said photoresist and cleaning the substrate after said etch process is complete.

10. The method of claim 1 wherein said second dielectric layer that is grown on the exposed device area is comprised of $SiO_2$ or silicon oxynitride preferably with an effective oxide thickness (EOT) of <10 nm.

11. The method of claim 1 wherein said interfacial layer and second dielectric layer are formed by a rapid thermal process in a temperature range of about 500° C. to 1000° C. for a period of about 10 to 500 seconds.

12. The method of claim 1 further comprising the steps of depositing a conductive layer following the high k dielectric anneal, forming a gate electrode in each device area, adding spacers on the sidewalls of the gate electrode, dielectric layers, and interfacial layer, forming source/drain regions, and forming contacts to the gate electrodes and to source/drain regions to complete the MOSFET devices.

13. The method of claim 12 wherein the resulting MOSFET containing the high k dielectric stack is a low power device and the MOSFET containing the oxide or oxynitride dielectric layer is a high performance device.

14. The method of claim 11 wherein a high k dielectric stack comprised of $ZrO_2$ and $Al_2O_3$ is subjected to a post-deposition anneal during the growth of a second dielectric layer comprising SiON, said anneal involving $NH_3$ which further reduces the leakage current and lowers the EOT in the resulting device.

15. The method of claim 11 wherein a high k dielectric stack comprised of $HfO_2$ is subjected to a post-deposition anneal during the growth of a second dielectric layer comprising $SiO_2$, said anneal involving $O_2$ which further reduces leakage current in the resulting device.

16. A method of forming triple gate dielectric layers on a substrate comprising:
   (a) providing a substrate with isolation regions that separate a first, second, and third device area;
   (b) depositing an interfacial layer on said substrate;
   (c) depositing a high k dielectric stack on said interfacial layer;
   (d) removing the interfacial layer and high k dielectric stack over said second and third device areas;
   (e) growing a second dielectric layer on the exposed second and third device areas;
   (f) removing the second dielectric layer over said third device area; and
   (h) growing a third dielectric layer on the exposed third device area, said growth simultaneously anneals said high k dielectric stack.

17. The method of claim 16 wherein the isolation regions are shallow trench isolation features in a silicon substrate.

18. The method of claim 16 wherein the interfacial layer is comprised of silicon oxynitride, $SiO_2$, or silicon nitride with a thickness between about 1 and 30 Angstroms.

19. The method of claim 16 wherein the interfacial layer is omitted and the high k dielectric stack is deposited on the substrate.

20. The method of claim 16 wherein the high k dielectric stack is deposited to a thickness of about 15 to 100 Angstroms.

21. The method of claim 16 wherein the high k dielectric stack is comprised of a high k dielectric material selected from the group including $Ta_2O_5$, $TiO_2$, $Al_2O_3$, $ZrO_2$, $HfO_2$, $Y_2O_3$, $L_2O_3$ and their aluminates and silicates.

22. The method of claim 21 wherein the high k dielectric stack is comprised of two or more layers comprised of one or more of said high k dielectric materials.

23. The method of claim 16 wherein removing one or more layers above one or more device areas comprises patterning a photoresist and using said pattern as an etch mask while undesired layers are etched away.

24. The method of claim 23 further comprised of stripping said photoresist and cleaning the substrate after said etch process is complete.

25. The method of claim 16 wherein a dielectric layer comprised of $SiO_2$ or silicon oxynitride with an effective oxide thickness (EOT) of <10 nm is deposited as the second dielectric layer and $SiO_2$ with a thickness in the range of 10 to 100 Angstroms is deposited as the third dielectric layer.

26. The method of claim 16 wherein the high k dielectric stack is annealed during said growth of said second dielectric layer on the exposed device areas.

27. The method of claim 16 wherein said interfacial layer and second and third dielectric layers are formed by a rapid thermal process in a temperature range of about 500° C. to 1000° C. for a period of about 10 to 500 seconds.

28. The method of claim 16 further comprising the steps of depositing a conductive layer following deposition of the third dielectric layer, forming a gate electrode in each device area, adding spacers to the gate electrodes, forming source/drain regions, and forming silicide regions on said gate electrodes and on the source/drain regions to form MOSFET devices.

29. The method of claim 28 wherein the resulting MOSFET containing the high k dielectric stack is a low power device, the MOSFET containing the second dielectric layer is a high performance device, and the MOSFET containing the third dielectric layer is an I/O device.

30. The method of claim 26 wherein a high k dielectric stack comprised of $ZrO_2$ and $Al_2O_3$ is subjected to a post-deposition anneal during growth of a second dielectric layer comprising SiON, said anneal involving $NH_3$ which further reduces the leakage current and lowers the EOT in the resulting device.

31. The method of claim 26 wherein a high k dielectric stack comprised of $HfO_2$ is subjected to a post-deposition anneal during the growth of a second dielectric layer comprising $SiO_2$, said anneal involving $O_2$ which further reduces leakage current in the resulting device.

* * * * *